(12) United States Patent
Degani et al.

(10) Patent No.: US 7,795,709 B2
(45) Date of Patent: Sep. 14, 2010

(54) SHIELDING NOISY CONDUCTORS IN INTEGRATED PASSIVE DEVICES

(75) Inventors: Yinon Degani, Highland Park, NJ (US); Yu Fan, Dallas, TX (US); Charley Chunlei Gao, Plano, TX (US); Kunguan Sun, Plano, TX (US); Liguo Sun, Plano, TX (US)

(73) Assignee: Sychip Inc., Plano, TX (US)

( * ) Notice: Subject to any disclaimer, the term of this patent is extended or adjusted under 35 U.S.C. 154(b) by 0 days.

(21) Appl. No.: 11/980,062

(22) Filed: Oct. 30, 2007

(65) Prior Publication Data

US 2008/0061405 A1   Mar. 13, 2008

Related U.S. Application Data

(62) Division of application No. 11/127,889, filed on May 12, 2005, now abandoned.

(51) Int. Cl.
*H01L 23/552* (2006.01)
(52) U.S. Cl. .................. 257/659; 257/758; 257/750; 257/E29; 257/508; 438/118

(58) Field of Classification Search ............... 257/758, 257/508, 750, 659, E29; 438/118
See application file for complete search history.

(56) References Cited

U.S. PATENT DOCUMENTS

| 5,585,664 | A * | 12/1996 | Ito .......................... 257/659 |
| 6,844,613 | B2 * | 1/2005 | Shimizu ..................... 257/659 |
| 2003/0062564 | A1 * | 4/2003 | Kobayashi et al. ........... 257/306 |
| 2004/0000701 | A1 * | 1/2004 | White et al. ................ 257/664 |

* cited by examiner

*Primary Examiner*—Wael M Fahmy
*Assistant Examiner*—Marc Armand
(74) *Attorney, Agent, or Firm*—Peter V. D. Wilde

(57) ABSTRACT

The specification describes a thin film Integrated Passive Device (IPD) design that achieves isolation between conductive runners by shielding the top and bottom regions of a noisy runner with metal shield plates. The shield plates are derived from metal interconnect layers. The invention can be implemented by merely modifying the mask pattern for the metal interconnect layers. No added elements or steps are needed to fabricate the IPDs. The invention is suitable for use in Multi-Chip Modules (MCMs) or other arrangements where digital circuits and RF circuits are in close proximity.

9 Claims, 6 Drawing Sheets

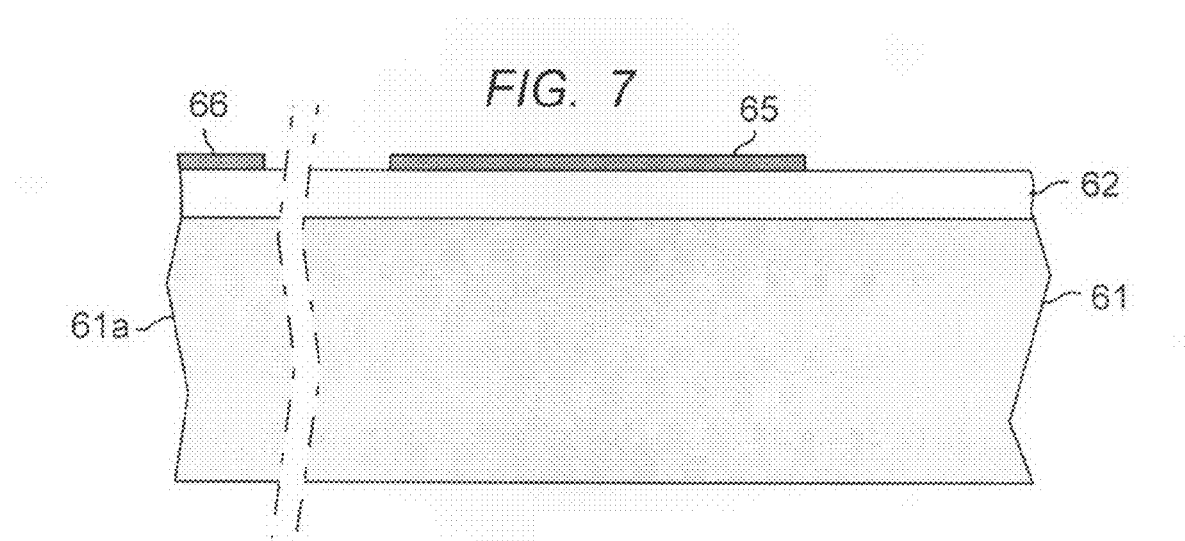
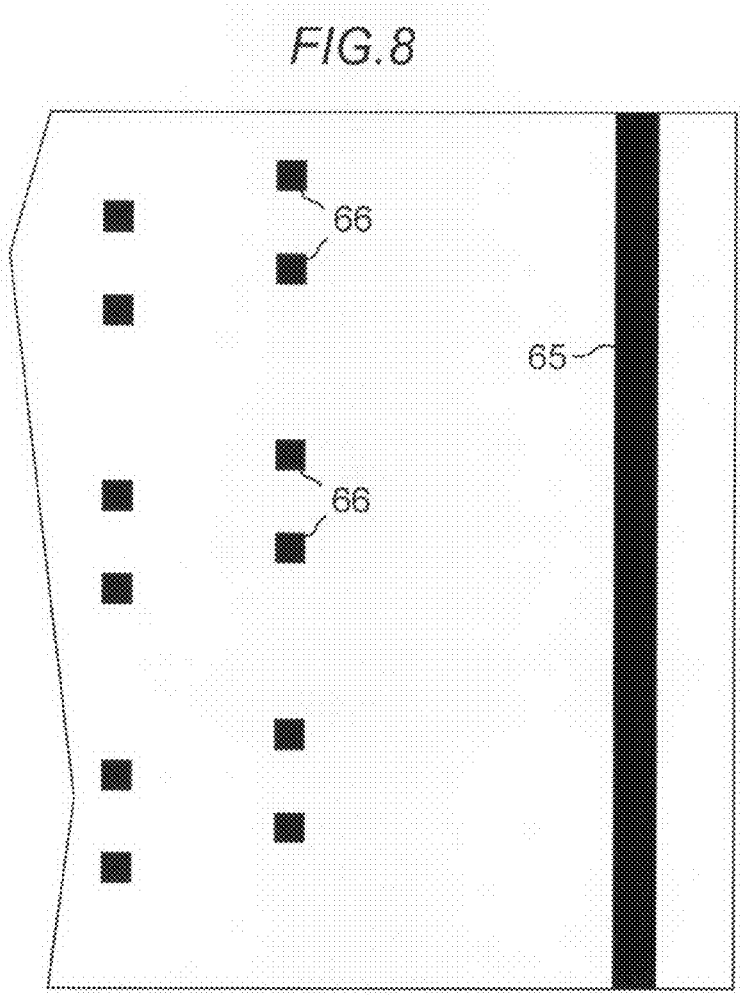

US 7,795,709 B2

SHIELDING NOISY CONDUCTORS IN INTEGRATED PASSIVE DEVICES

RELATED APPLICATION

This application is a Division of application Ser. No. 11/127,889, filed May 12, 2005 now abandoned.

FIELD OF THE INVENTION

This invention relates to reducing noise due to electromagnetic interference (EMI) in thin film integrated passive devices (IPDs). More specifically it addresses reducing noise created by noisy conductive runners by shielding the offending runners with metal layers.

BACKGROUND OF THE INVENTION

Detrimental EMI effects in electrical devices such as RF integrated circuits are well known. With advances in component density, and the high frequencies and diversity of elements characterized by state of the art thin film IPDs, detrimental noise problems in IPDs is a relatively new issue. However, for optimum performance, noise from conductive runners, typically digital lines such as clock lines, needs to be addressed. The need for addressing EMI in IPDs arises especially in thin film IPDs, and thin film IPDs in Multi-Chip Modules, or similar arrangements where runners carrying digital signals are located in close proximity with IPD components carrying RF signals.

BRIEF STATEMENT OF THE INVENTION

According to one aspect of the invention, a thin film IPD design that achieves isolation between conductive runners is produced by shielding the top and bottom regions of a noisy runner with metal shielding plates. The shielding plates are derived from metal interconnect layers. The invention can be implemented by merely modifying the mask pattern for the metal interconnect layers. No added elements or steps are needed to fabricate the IPDs. The invention is suitable for use in Multi-Chip Modules (MCMs) where digital circuits and RF circuits are in close proximity.

BRIEF DESCRIPTION OF THE DRAWING

The invention may be better understood when considered in conjunction with the drawing in which:

FIGS. 6 and 7 are schematic views illustrating process steps suitable for the manufacture of devices according to the invention;

FIG. 8 is a schematic view of a larger portion of the metal layer of FIG. 7 that forms part of the shielding.

DETAILED DESCRIPTION OF THE INVENTION

Figure 1:
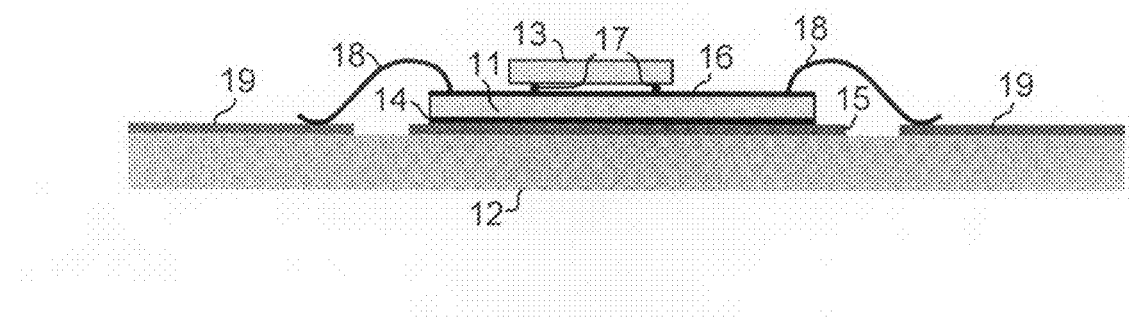
FIG. 1 is a schematic view of an IPD incorporated in a Multi-Chip Module (MCM) arrangement.

FIG. 1 is a view of an IPD MCM, where IPD 11 is shown mounted on a printed circuit board (PCB) 12. An IC chip 13 is shown mounted on the IPD. For simplicity, only one IC chip is shown. Typically there may be more than one. These IC chips can be an analog device, digital device, mixed signal device, RF device, and/or a micro-electro-mechanical-system (MEMS) based switch or oscillator. In most applications of the invention described here, at least one of the MCM chips will be a digital IC chip. Digital IC circuits contain noisy conductor runners, such as clock circuit runners. These are the conductors most likely to be addressed by the shielding arrangement of the invention. However, parasitic interactions occur between sensitive elements in the IPD and other external influences in the vicinity of the IPD. These adverse influences become more severe as the size, and thickness, of the IPD chip is reduced.

A common choice for mounting the MCM to the PCB is solder. Referring again to FIG. 1, a solder bonding layer is shown at 14, with PCB ground plane at 15. The upper surface of the IPD is coated with a ground plane, and metal runners for interconnecting the IC chip, typically placed on two levels. These are represented as layer 16 in the figure, and connect to the IC chip through solder bumps 17. The solder connection may be different from conventional flip chip connections in which the distance between the flip chip and substrate is kept at a maximum to maintain reliability, i.e. typically 70 to 120 um. It may have a small bump height, under 70 um, to accommodate the flatness variations between the IPD and the IC. Due to the similarity in thermal coefficient of expansion between the active IC and the IPD, there is less concern for solder joint reliability with a shortened distance. Furthermore, this reduction in distance will also contribute to the reduction of the overall thickness of the module. With this approach, that thickness, including the overmolding, made be made small, for example, not exceeding 1.0 mm overall thickness. This reduction in the distance also reduces the parasitic resistance and inductance, to further improve the performance of the RF circuits. Besides solder, other commonly known methods, for example, gold-to-gold, gold-to-aluminum, and conductive adhesives, are also within this scope of this invention.

Wire bonds 18 connect the ground plane and runners to interconnections 19 on the PCB. Beside wire bonding, holes can be etched in the IPD, connecting the metal traces on the top and bottom surfaces of the IPD. This etching process is a commonly practiced MEMS manufacturing process. The IPD, with through holes, is attached to the substrate by conventional flip chip assembly process. The through hole connection further reduces the interconnect distance between the IPD and the substrate.

It is understood by those in the art that the assembly shown in FIG. 1 is encapsulated in a polymer housing. The plastic housing may be a plastic overmolded body, as in most conventional devices, or may be a plastic cavity package or other suitable protective package.

Figure 2:
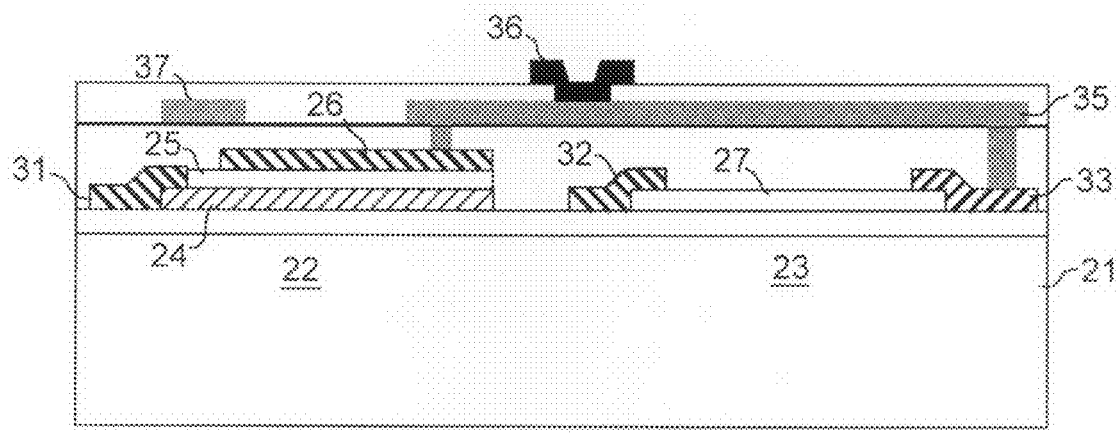
FIG. 2 is a section view showing a portion of the IPD to illustrate a typical multi-level metallization design.

FIG. 2 is a section view of a portion of the IPD 11 of FIG. 1. The figure illustrates the interconnections provided for two typical components, capacitor 22, and resistor 23. The bottom capacitor plate is indicated at 24, the capacitor dielectric at 25, and the top capacitor plate at 26. The resistor body is shown at 27. Runners 31. 32 and 33 interconnect the bottom capacitor plate and the resistor body. Runner 35 interconnects the capacitor and resistor as shown. In this illustration runner 37, on the same metal level as interconnection 35, is a digital interconnection carrying a noisy signal. Under-bump-metallization (UBM) is shown at 36, on the next metal level. The UBM is provided to accommodate a solder bump, such as that shown at 17 in FIG. 1.

There are four levels of metallization shown in FIG. 2. The first level is lightly cross-hatched, and comprises capacitor plate 24. The second level is more heavily cross-hatched, and comprises the upper capacitor plate 26 and the runners 31, 32, and 33. The third level is lightly shaded, and comprises capacitor-resistor interconnection 35 and noisy runner 37. The fourth level is darkly shaded, and comprises UBM 36. It will be understood by those skilled in the art that a thin film IPD may have fewer, or more, metal levels. It will also be understood that runner 37, a noisy runner as will be seen, may reside at any position or level in the structure.

It can be seen that if runner 37 carries a clock signal, or other noisy signal, the potential for EMI with capacitor 22, or with other elements in the multi-level structure is significant.

Figure 3:
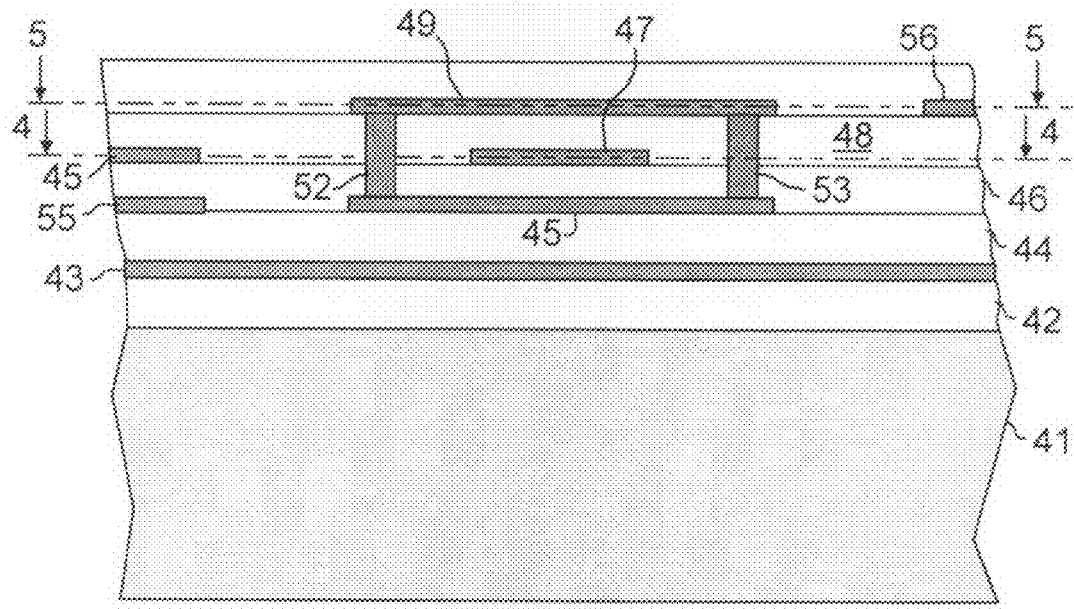
FIG. 3 shows one embodiment of the shielding plates of the invention.

To overcome this problem, runner 37 is shielded in a metal structure like that shown in FIG. 3. In this layout, the noisy runner is located in an intermediate level, and metal shields are formed around it. The noisy runner is indicated by 47. The interconnection arrangement of FIG. 3 still has four levels, but runner 47 is part of level 3, instead of level 4. This is not a necessary feature of the invention, but simply an illustration of the variety of applications suitable for the invention. Also in this illustration, level 3 has other interconnect element(s) represented by 51. In FIG. 3, the IPD substrate is shown at 41, covered with dielectric layer 42. Interlevel dielectric layers are 44, 46, and 48. Metal level 1 is shown at 43, metal level 2 comprises runner 55 and shield plate 45, metal level 3 comprises runners 51 and 47, and metal level 4 comprises runner 56 and shield plate 49. In the shielding region, the shield plate 45 of metal 2 and the shield plate 49 of metal 4 are connected with a series of vias represented by 52 and 53. The shield plates 45 and 49 are connected to ground or another fixed potential. Electrically, they may not be part of the circuit interconnections, i.e., the circuits may function without these elements. However, a feature of the invention is that the plates 45 and 49 formed as parts of metal interconnect layers that do function as circuit interconnections. A circuit interconnection in metal level 2 is indicated by runner 55, a circuit interconnection in metal 3 is indicated by runner 51, and a circuit interconnection in metal level 4 is represented by runner 56. It should be apparent that features 45 and 55 are formed simultaneously by patterning the level 2 metal layer, and features 49 and 56 are formed simultaneously by patterning the level 4 metal layer. While elements 55 and 56 are referred to as runners for circuit interconnection, they can as well be parts of circuit components for example, capacitor plates or inductor spirals. It is also within the scope of the invention to form shield plates 45 and 49 in metal levels that do not have other interconnection runners. Also, it should be understood that either or both of shield plates 45 and 49 may form parts of circuit interconnections as long as they are at the same circuit potential. Typically this will be ground.

Figure 4:
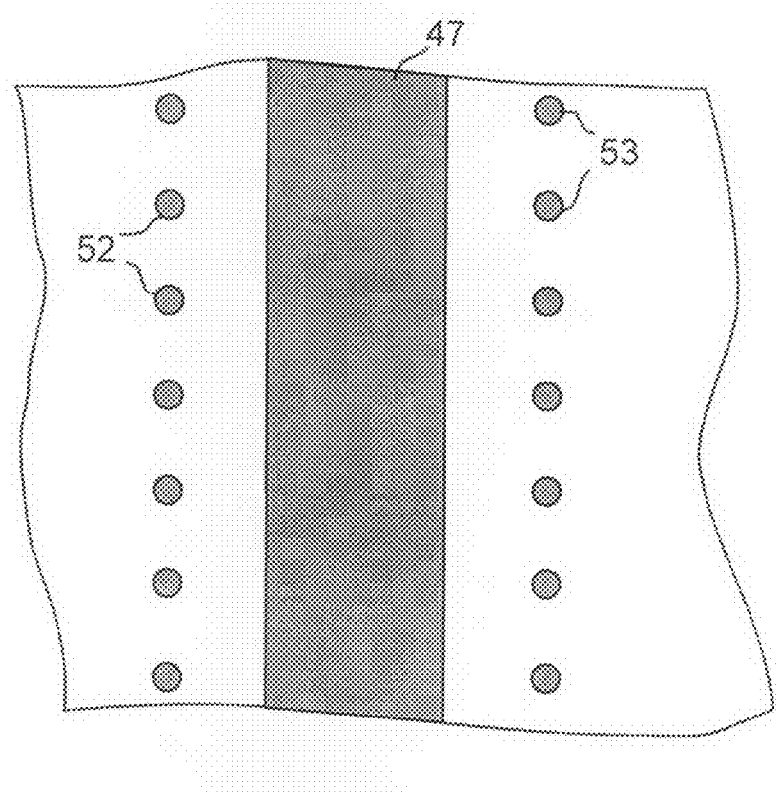
FIG. 4 is a plan view of the section through 4-4 of FIG. 3.

FIG. 4 shows a view through 4-4 of FIG. 3. The runner being shielded, i.e. the noisy runner, is shown at 47, and the vias that form part of the shield are shown in 52 and 53.

Figure 5:
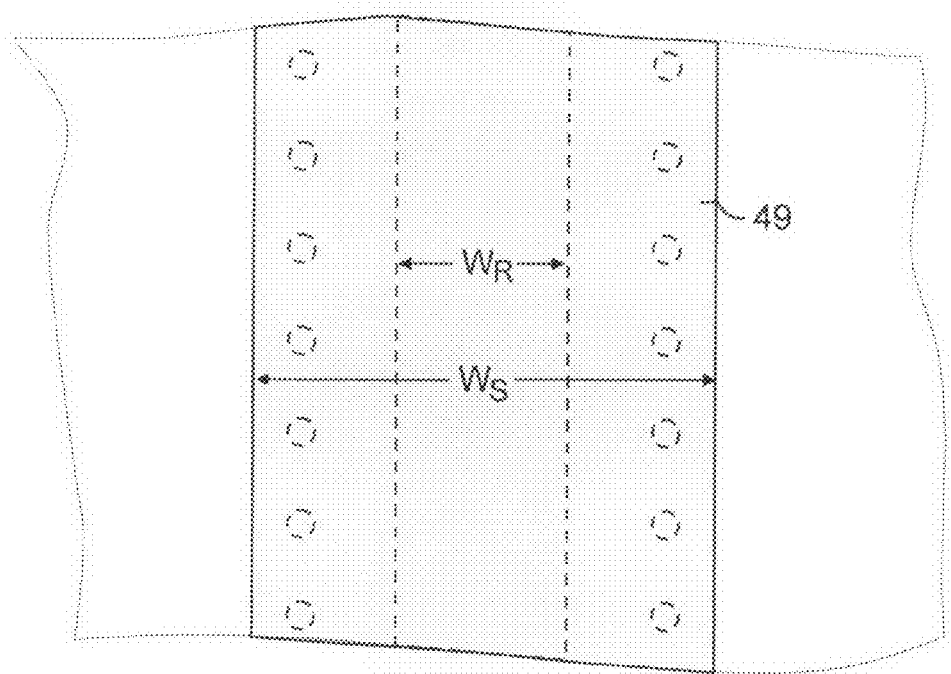
FIG. 5 is a plan view of the section through 5-5 of FIG. 3.

FIG. 5 shows the section 5-5 of FIG. 3. This is a section through the upper shield plate, i.e. 49. The runner 47 is indicated by the dashed line and is beneath the shield plate. The shield plate has a width, $W_S$, that preferably is substantially larger that the width $W_R$ of runner 47. A typical width for runner 47 is 5-75 microns. A recommended width $W_S$ for the shield 49 is:

$$W_S > 1.5\, W_R$$

and preferably:

$$W_S > 2\, W_R$$

The overall shielding structure of FIGS. 3-5 may be recognizable as the functional equivalent of a Faraday cage.

FIGS. 2-5 illustrate but one interconnection arrangement for a typical IPD. A wide variety of similar arrangements will be found in typical IPDs. As mentioned above, an aspect of the preferred embodiments of the invention is that the shielding structure is formed as part of the interconnection layers. Features in the device can be identified as being formed as part of a common metal level because the distance separating the features from another level, or from the substrate, will be approximately the same.

FIGS. 6-11 illustrate steps in the fabrication of the structure shown in FIGS. 3-5.

Figure 6:
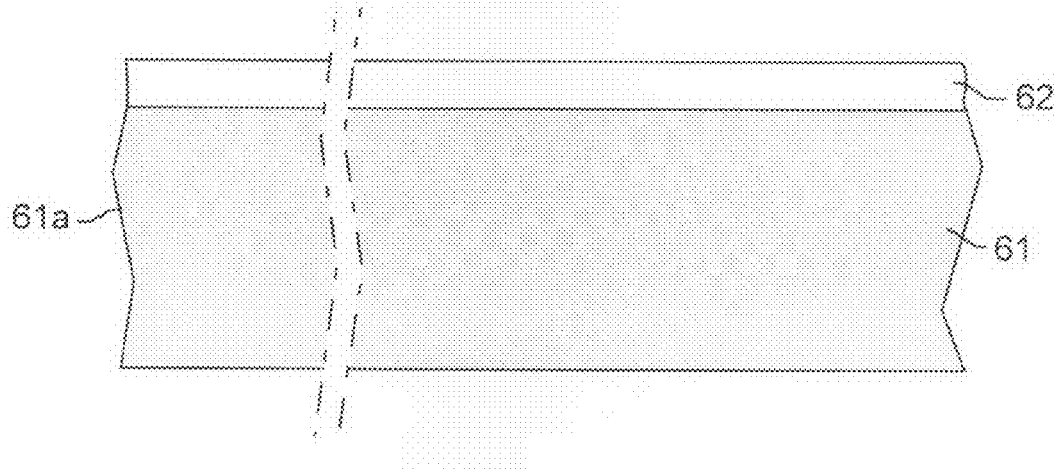

In FIG. 6 the IPD substrate is shown at 61, covered with an insulating layer 62. The IPD substrate may be polysilicon, and the insulating layer $SiO_2$. More details on the fabrication of IPDs may be found in co-pending application Ser. No. 11/030,754, filed Jan. 6, 2005, which is incorporated herein by reference. To aid in understanding the relationship between the shield plates and other electrical features in the circuit(s) FIG. 6 and subsequent figures show two portions of the substrate 61, and 61a, separated by an arbitrary distance.

FIG. 7 illustrates the application of the first level metal. The metal portion 65 will form the lower part of the shield, and corresponds to element 45 in FIG. 3. The portion 66 of the first level metal, spatially removed from portion 65, forms a circuit element, in this case the lower plate of a capacitor. The circuit element may comprise any feature of the electrical circuit of the device. For example, element 66 may correspond to a portion of plate 24 in FIG. 2. Another likely choice is a runner interconnecting another circuit component. The term circuit element means an element that is a part of an electrical circuit, and is connected to power, ground, or a digital or RF signal.

The first level metal layout in this embodiment is shown in plan view in FIG. 8, where the lower shield plate is shown at 65, and a plurality of lower capacitor plates at 66.

It will be understood by those skilled in the art that the metal levels are fabricated in a conventional manner, with a blanket deposition of metal on the surface of the device, the application of a suitable masking layer, typically a photo-lithograhic mask, and removal of the exposed metal by etching. The etching step may involve a liquid etchant, or may be a plasma etching step. These processing operations are well known and need no further exposition here.

Figure 9:
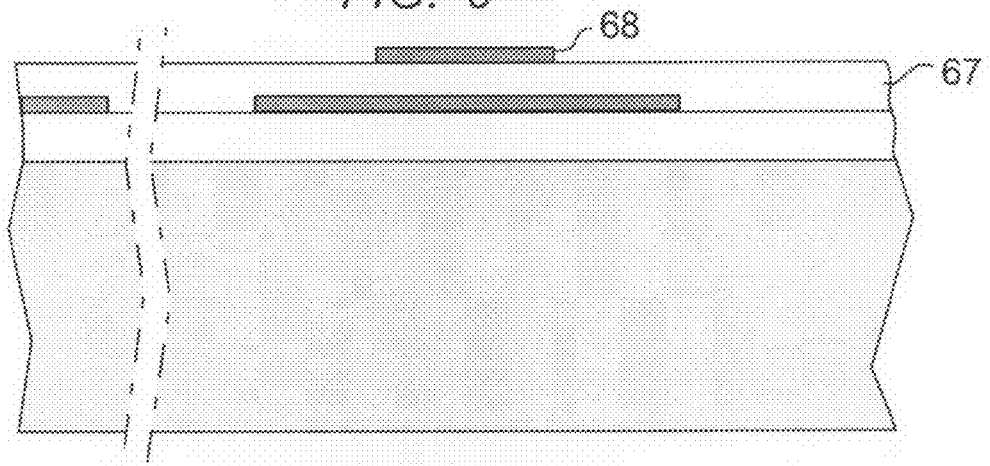
FIGS. 9-11 are schematic views illustrating process steps following that represented by FIG. 7.

FIG. 9 shows a second level metal, comprising metal runner 68. This is the runner that carries a noisy signal, and will accordingly be shielded.

Figure 10:
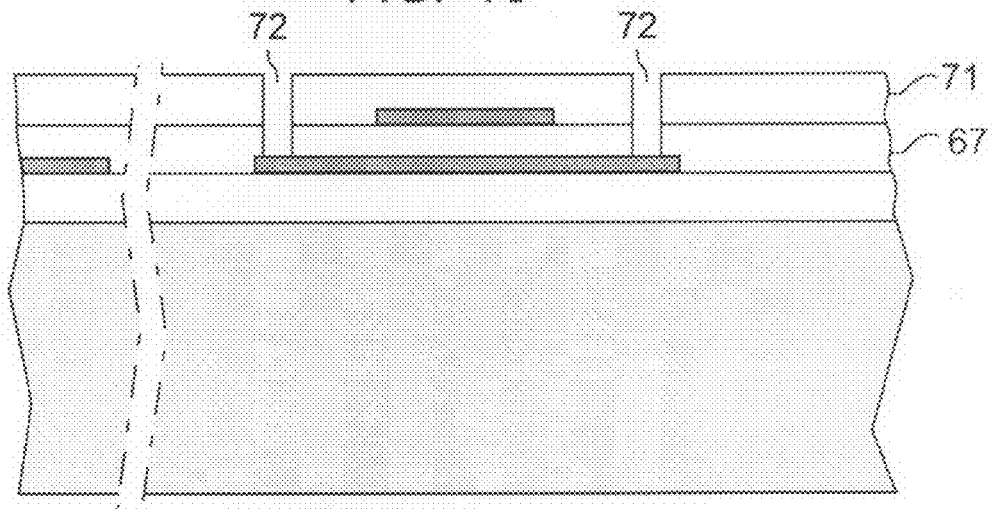

In FIG. 10, interlevel dielectric layer 71 is shown applied over the second level metal. Vias 72, corresponding for example to elements 52 and 53 in FIG. 4, are formed through interlevel dielectric layers 67 and 71.

Figure 11:
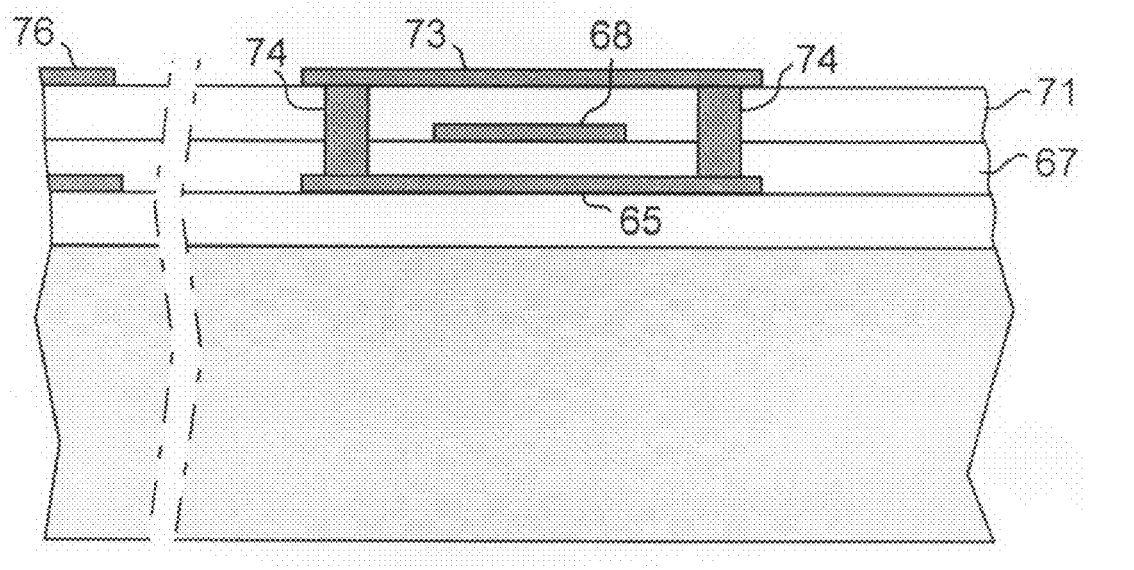

FIG. 11 shows a third metal level comprising the top shield 73, and metal vias 74 connecting the top shield 73 to the bottom shield 65. Elements 73, 74, and 68 form a Faraday cage as described earlier. The third level metal also comprises a circuit element 76. This element is part of the overall electrical circuit for the device. It may function, for example, as a runner forming an interconnection for circuit components, or it may comprise a portion of a circuit element itself, for example the top plate of a capacitor, or an inductor spiral. The point is that both shielding plates 65 and 73 are formed as part of a metallization layer that has other elements that perform an electrical function in the circuit.

In an alternative embodiment of the invention, just one of the shielding layers comprises a portion of a metallization layer forming elements of the electrical circuit. The other shielding layer is part of a metallization layer formed only to provide a shield plate.

For purposes of definition, the portions of the metallization that serve the shielding function but may not perform an active device interconnection are defined as shield metallization, or shield metallization portions. The parts of a metallization layer that serve as interconnections for electrical components in the device may be referred to as active metallization or active metallization portions. A metallization layer or metallization level means a pattern of metal deposited in a single deposition step, and generally wherein the metal resides on a common level. Alternatively, the shield metallization portions may be referred to as metal islands, to indicate that they may be electrically isolated from surrounding interconnect metal on a given level. A ground connection to the shield plates may be made through a via to another level.

Electrical components in an IPD typically comprises capacitors, resistors and inductors. The capacitors will normally be formed using two metallization levels, i.e. one level for the bottom capacitor plate and one level for the top capacitor plate. Resistor contacts may be formed using one metallization level for both resistor contacts or two metallization levels for the resistor contacts. Inductors may be formed using one level for the inductor spiral and one or more levels for the inductor contacts. Thus, in the thin film implementation of an IPD (as described in the application referenced earlier) there are typically more than one metallization level that interconnects the IPD components. When reference is made to IPD active metallization it should be understood to mean any combination of the parts of the IPD components, including the contacts, and the metal runners interconnecting them.

In the structure shown to illustrate the invention, the metal shields are formed at one level above and one level below the noisy runner. While that arrangement is most likely, a possible alternative in some cases may be to place one or both of the metal shields on a level removed from the noisy runner, for example, level one may include a metal shield, level two a noisy runner, and level four another metal shield. In this case the vias that interconnect the metal shields will extend through two levels.

Reference made above, and in the appended claims, to "first", "second" etc. in connection with metallization levels, is intended to convey a sequence, so the first metallization layer or level refers to the first in the recited sequence, and may or may not be the first layer or level in the device.

Reference to an insulating substrate is intended to mean that the surface of the substrate comprises insulating material. The surface may be the surface of a bulk insulating substrate, or may be a layer of insulating material covering the bulk substrate. In high performance IPDs it is usually important that the bulk material as well as any surface layers be insulating. As should be evident from the thorough description of substrate materials in the application referenced above, undoped, or very lightly doped, polysilicon qualifies from this standpoint, and is a preferred bulk substrate. The polysilicon may be covered with $SiO_2$.

The metallization layers may be formed by either substractive or additive processing. The term selective deposition, or selectively depositing, is intended to refer to both.

Various additional modifications of this invention will occur to those skilled in the art. All deviations from the specific teachings of this specification that basically rely on the principles and their equivalents through which the art has been advanced are properly considered within the scope of the invention as described and claimed.

The invention claimed is:

1. An integrated passive device (IPD) comprising a plurality of IPD components and having a multi-level structure of at least three levels, level one, level two and level three, where the multi-level structure is situated in an essentially horizontal plane and:
  (a) level one comprises:
   i. at least one runner connected to an IPD component,
   ii. a level one metal shield plate having a width Ws, the level one metal shield plate being electrically isolated from IPD components,
  (b) level two comprises a noisy runner,
  (c) level three comprises:
    a level three metal shield plate having a width $W_s'$ the level three metal shield plate being electrically isolated from IPD components,
wherein the level one metal shield plate and the level three metal shield plate are connected to a fixed potential, and further wherein the level one metal shield plate, the noisy runner, and the level three metal shield plate are in vertical alignment.

2. The device of claim 1 including additional metallization levels.

3. The device of claim 1 wherein the level one metal shield plate and the level three metal shield plate are connected together with a plurality of vias extending vertically from level one to level three.

4. The device of claim 1 wherein the noisy runner is connected to a digital component.

5. The device of claim 1 wherein the noisy runner has a width $W_R$ in the range 5-75 microns.

6. The device of claim 1 wherein the noisy runner has a width $W_R$, and $W_s$ and $W_s'$ are both greater than $W_R$.

7. The device of claim 3 wherein either or both of the shield metallization portions are connected to ground.

8. The device of claim 6 wherein $W_s$ and $W_s'$ are greater than $2 W_R$.

9. The device of claim 1 wherein $W_s$ and $W_s'$ are equal.

* * * * *